United States Patent [19]

El Gammal et al.

[11] 4,175,609

[45] Nov. 27, 1979

[54] PROCESS AND APPARATUS FOR THE MOLDING OF SHAPED ARTICLES FROM A COMPOSITE METALLIC REFRACTORY MATERIAL

[75] Inventors: Maurice El Gammal, Clamart; Maurice Rabinovitch, Chatillon, both of France

[73] Assignee: O.N.E.R.A. - Office National d'Etudes et de Recherches Aerospatiales, Chatillon, France

[21] Appl. No.: 822,261

[22] Filed: Aug. 5, 1977

[30] Foreign Application Priority Data

Aug. 11, 1976 [FR] France ................................. 76 24539

[51] Int. Cl.$^2$ .............................................. B22D 25/06
[52] U.S. Cl. ...................................... 164/60; 164/126; 164/348
[58] Field of Search ................... 164/60, 80, 122, 123, 164/125, 126, 127, 128, 348; 249/118

[56] References Cited

U.S. PATENT DOCUMENTS

| 3,244,852 | 4/1966 | Herterick et al. | 164/46 |
| 3,322,183 | 5/1967 | Johnston et al. | 164/80 |
| 3,584,676 | 6/1971 | Busquet | 164/60 |
| 3,763,926 | 10/1973 | Tschinkel et al. | 164/60 |
| 3,770,047 | 11/1973 | Kirkpatrick et al. | 164/60 |
| 3,973,750 | 8/1976 | Rabinovitch et al. | 249/114 |

*Primary Examiner*—Othell M. Simpson
*Assistant Examiner*—K. Y. Lis
*Attorney, Agent, or Firm*—Karl F. Ross

[57] ABSTRACT

Disclosed are a method and apparatus for molding articles in which a highly planar solidification front is desired. A charge of liquefied alloy to be molded into the desired article is placed in a mold and submerged in a heat-exchange bath of liquid metal forming a cylindrical column which is heated in an upper portion and cooled in a lower portion to define an intermediate level at which the bath temperature corresponds to the melting point of the alloy. Upon a progressive lowering of the mold within the bath, a solidification front formed in the alloy at that intermediate level advances from the bottom to the top of the charge.

16 Claims, 2 Drawing Figures

PROCESS AND APPARATUS FOR THE MOLDING OF SHAPED ARTICLES FROM A COMPOSITE METALLIC REFRACTORY MATERIAL

BACKGROUND OF THE INVENTION

1. Field of the Invention

Our present invention relates to a process and an apparatus for the molding of shaped articles from a composite metallic refractory material.

The refractory composite materials which may be molded according to our invention comprise a complex matrix of a superalloy having a base of one or more ferrous metals, i.e. nickel and/or iron and/or cobalt, which contains chromium and a reinforcement phase constituted by monocarbide fibers of the transition metals. These composite materials are manufactured by the unidirectional solidification of an appropriate starting alloy. They are particularly useful in the manufacture of workpieces which are to be used at elevated temperatures, such as for example aeronautical turbine blades.

2. Description of the Prior Art

Refractory composite materials, such as described for example in commonly owned French Pat. No. 2,040,931 (see U.S. Pat. No. 3,871,835), are presently prepared in the form of slabs having simple geometrical shapes from which the more complex workpieces, such as the turbine blades mentioned hereinabove, are machined.

An attempt has been made to bypass the machining operation in order to directly obtain articles of complex shape by effecting the unidirectional solidification of the alloys in molds which directly impart the required dimensional precision and surface state to the molded pieces. Yet, such a procedure requires operating conditions which are extremely difficult to achieve. It is necessary, in effect, to obtain in all the straight sections of the article a structure, having columnar grains parallel to the direction of solidification of the material, in which each of the grains has a regular fibrous microstructure constituted by monocrystalline carbide fibers spaced from one another by about 10 microns. The diameter of the fibers is on the order of about 1 micron.

Since the growth of the grains is directed perpendicularly to the solidification front, and since the two phases of the composite crystallize simultaneously in each grain from the liquid growing perpendicularly to the solidification front, the solidification front must be rigorously planar. Moreover, in order to avoid the germination of parasitic grains forwardly of the solidification front as well as any cellular or dendritic-type disturbance of the growth of the composite material, the temperature gradient at the level of the solidification front must be of an elevated value, on the order of about 100° to 200° C./cm. In fact, the greater the solidification interval of the alloy and the greater the speed of the displacement of the solidification front, the greater ought to be the value of this gradient.

For this reason, the speed of displacement of the solidification front, which can be on the order of a fraction of a centimeter to several centimeters per hours, must be maintained at a constant value.

For workpieces of complex shape, in which the evolution of the shape of the section along the entire length of the workpiece entails a continuous variation of the surfaces that are in heat-exchanging relationship with the hot and cold sources, a continuous modification of the thermal flux at the level of the solidification front results. Satisfaction of all the conditions recited hereinabove has proven to be extremely difficult.

An apparatus for directional solidification with high thermal gradients has been described by G. J. May in the *Journal of Physics E; scientific instruments,* page 354, volume 8, May 1975. In this device the alloy meterial being heated is passed first through a heating zone and then into a cooling zone. The heating zone consists essentially of induction coils while the cooling zone is constituted by a liquid-metal bath. The device is, however, unsuitable for use in solidifying articles of complex shape by reason of the lack of planarity of the solidification front.

OBJECTS AND SUMMARY OF THE INVENTION

It is an object of our present invention to provide a process and an apparatus which obviate the encountered difficulties and by which it is possible to obtain shaped articles made from refractory composite materials.

A more particular object of our invention is to provide a process and an apparatus suitable for utilization on an industrial scale.

In accordance with our present invention, the molding of shaped articles from a metallic refractory composite material by the unidirectional solidification of the composite material in a mold of corresponding shape involves the complete immersion of a charge-receiving part of the mold throughout the process in a liquid-metal bath confined within a cylindrical column. The mold is subjected to heat exchange with an upper part of the column, heated above the melting point of the composite material, and a lower part of the column cooled below that melting point so that there exists an intermediate level at which the melting point of the mold charge substantially equals the bath temperature. With the mold initially placed with its bottom at that intermediate level, so that the mold charge is heated above its melting point by the surrounding bath, a progressive lowering of the mold with reference to that level continuously advances a highly planar solidification front in the composite material from the mold portion to the top of the charge.

Such a process enables a solidification executed under thermal conditions close to those of molding of a cylindrically shaped slug and makes it possible to satisfy the required conditions of planarity of the solidification front, of an elevated thermal gradient at the level of that front and of a constant speed of displacement of the front.

An apparatus according to our invention comprises, accordingly, a cylindrical upright container for a liquid-metal bath and mounting means for supporting a mold in the interior of that container, immersed in the bath, for thermal interaction of its charge with adjustable heat-generating means including a heater surrounding an upper part and a cooler surrounding a lower part of the container. Relative vertical movement of the mounting means and the heat-generating means causes the charge to descend through a neutral zone, lying at an intermediate level between the heater and the cooler, for continuously displacing the solidification front of the composite from the bottom to the top of the charge.

The liquid-metal bath chosen for our process has a melting point significantly below that of the alloy treated and a thermal conductivity close to that of the alloy, at least at temperatures near the melting point of the alloy.

The chosen metal of the liquid bath is chemically inert at all temperatures vis-a-vis the material constituting the mold and has a low vapor pressure up to the temperatures at which the process is carried out which may be on the order of 1700° C.

Satisfying results have been obtained with bath metals such as those of the group of tin, gallium or indium, the tin being however preferred for reasons of cost.

The progressive lowering of the mold relative to the neutral zone from its starting position to its end position, resulting in the desired displacement of the solidification front, may be carried out either with or without a concurrent movement of the container relative to the heat-generating means. In the first instance, the container and the mold descend jointly in a housing carrying the heater and the cooler; in the second instance, the container forms part of the housing and only the mold mounting is movable. In either case we provide a temperature sensor, fixedly positioned with respect to the housing, which lies in the neutral zone and controls the energization of the heater to keep the bath temperature at the aforementioned intermediate level substantially equal to the melting point of the charge.

BRIEF DESCRIPTION OF THE DRAWING

Other features and advantages of our invention will become apparent from the following detailed description, reference being made to the annexed drawing in which.

DETAILED DESCRIPTION

Figure 1:
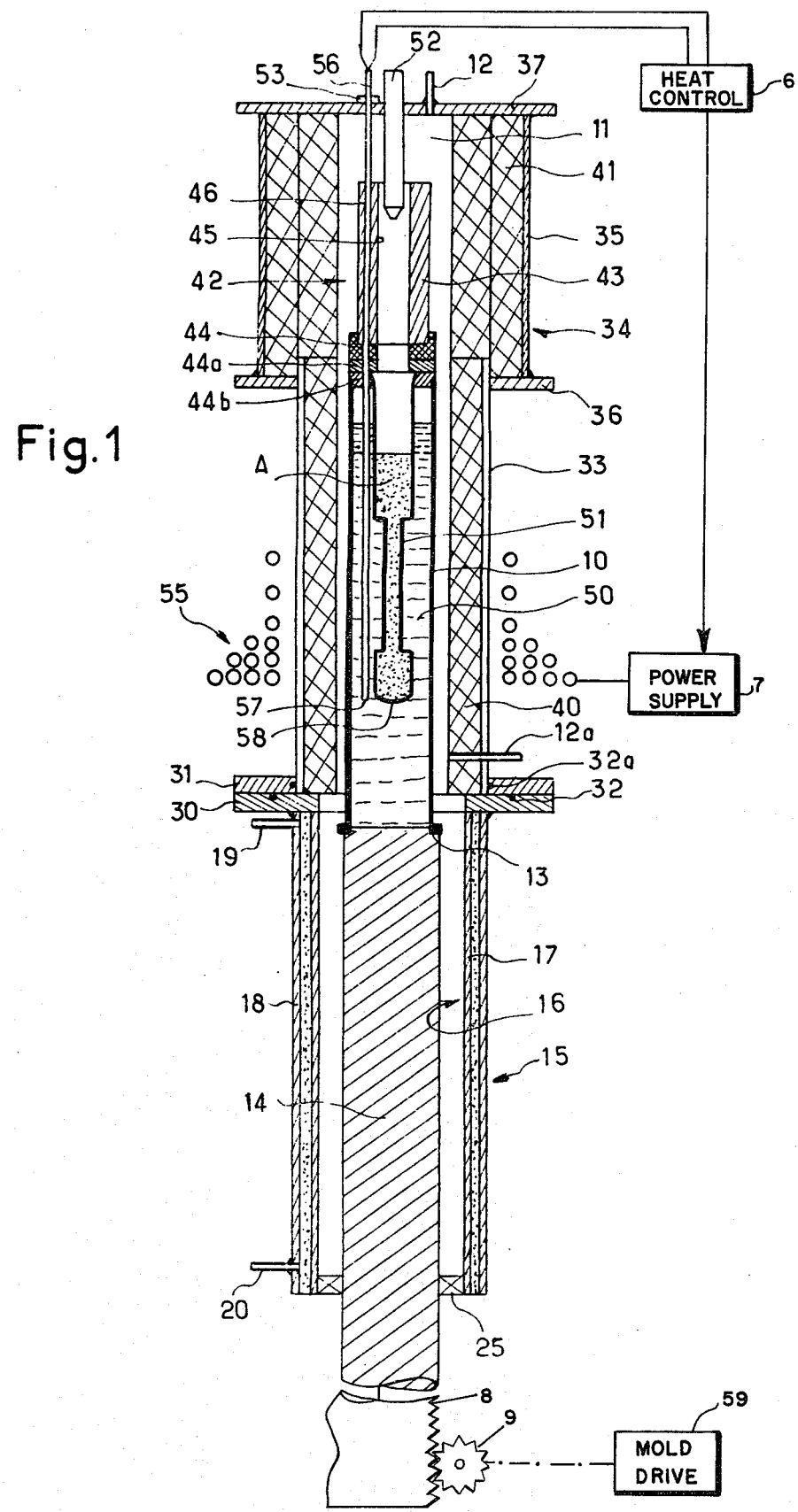
FIG. 1 is a schematic view, in longitudinal cross-section, of an apparatus according to a first embodiment of our invention.

FIG. 1 shows an apparatus according to our invention comprising a graphite tube 10 disposed vertically in a chamber 11 in which an inert gas such as for example argon may be circulated. Circulation takes place by means of piping having an inlet 12 at the upper end of the chamber and an outlet 12a at the lower end thereof. The tube 10 rests, with the interposition of a sealing joint 13, e.g. of graphite packing, on a solid steel piston 14, mounted for longitudinal sliding in a cooler 15. The cooler is constituted by a copper sleeve 16 having two walls 17 and 18 between which there is a space for the circulation of water supplied by a feed tube 19 at the upper end of the cooler and removed by a discharge tube 20 at its lower end. The transfer of the heat of the piston 14 toward the copper sleeve occurs by radiation. A lipped joint 25, at the lower end of the cooler 15, forms a seal around the movable piston 14.

A quartz casing 33, whose upper part is capped by a sleeve 34 enclosing the chamber 11, is held by clamps 30 and 31 on the cooler 15, with interposition of a sealing joint 32 between the two clamps and a sealing joint 32a between the base of the casing and the clamp 31. The sleeve 34 has a cylindrical peripheral wall 35, a base 36 and a cover 37 traversed by the tube 12. The casing 33 is fitted along its inner wall surface with a thermally insulating screen 40, designed to reduce the radial heat losses, spacedly surrounding the container 10. In analogous fashion, the peripheral wall 35 of the sleeve 34 is fitted with an insulating screen 41 which also envelops a mounting device 42 located in the upper part of the tube 10. The device 42 comprises a heavy sleeve 43, having an axial passage 45 and narrower off-axial longitudinal bore 46, which rests with its lower end on an insulating sleeve 44 engageable by clamps 44a and 44b of graphite packing fixed in a removable fashion, by means not shown, on tube 10.

Container 10 is filled with a liquid-metal bath 50 in which there is partially submerged a mold 51 supported at its upper end by the clamps 44a and 44b of the mounting device 42; this mold is charged with an alloy A to be treated by unidirectional solidification. The alloy charge is introduced into the mold by an axial conduit 52 traversing the cover 37 of the sleeve 34 and extending partly into the central passage 45 of the device 42.

A coil or inductor 55 surrounds the sleeve 33, forming the heat source of the apparatus, while the graphite tube 10 plays the role of a susceptor.

The metal constituting the bath 50 is chosen to have a thermal conductivity which differs as little as possible from that of the alloy to be solidified, in the range of the melting temperature of the alloy. It is chemically inert with respect to the material constituting the mold 51; it has a low vapor pressure up to temperatures which may be on the order of 1700° C.; and finally it has a melting point significantly below that of the alloy.

Tin, gallium and indium each satisfy these conditions. As stated above, we prefer tin because it is less expensive.

In order to duplicate the conditions of manufacture of a slab having a simple geometrical shape, the mold 51 immersed in the liquid-metal bath should have a shell of small thickness, advantageously a one-piece shell of a refractory oxide such as that of aluminum or zirconium, of very high purity (greater than 99.5%); this material should have a very low porosity (several percent) and may be made, for example, by deposition with an oxy-acetylene blow-pipe or a plasma pistol on a model which is subsequently eliminated, in the manner described in commonly owned U.S. patent application Ser. No. 659,014 filed by one of us, Maurice Rabinovitch, jointly with Pierre Magnier on Feb. 18, 1976, whose disclosure is herein incorporated by reference. The mold shell is subsequently annealed at an elevated temperature, on the order of 1800° C. Annealing causes a recrystallization contributing to good mechanical resistance which makes it possible to avoid deformation by creep at high temperatures. Such deformation could be a problem by reason of the elevated temperature gradient at the level of the solidification front since the gradient involves a significant heating (up to 1700° C.) of the alloy maintained in prolonged contact with the mold, and also because of the slow displacement speed of the solidification front.

The operation of the apparatus of FIG. 1 will now be described.

After removal of the cover 37, the tube 10 is filled with tin. The base of the inductor 55 is placed at a distance from the level at which cooling begins, known as the "level of reference" of the cold source or heat sink 15. This level is defined by the junction plane of the clamps 30 and 31. The distance of the base of the inductor 55 from the level of reference is a function of the thermal gradient to be obtained. The inductor is then operated with a power just sufficient to liquefy the tin. Through the bore 46 of sleeve 43, a thermocouple 56 slidably mounted on the cover 37 by a support 53 can be lowered into the container 10. The mold 51 is introduced into the liquid-tin bath to such a depth that the lower end 58 of the mold is at the level of the sensing joint 57 of the thermocouple. The joint is placed at a short distance below the inductor 55, at an intermediate level between the base of the inductor and the reference level of the cold source, in a zone in which heat is neither added nor removed and in which, moreover, in the absence of any heat exchange by way of the peripheral wall of the apparatus, the isotherms are substantially perfectly planar.

The mold is weighted down by the heavy sleeve 43 and is thus prevented from floating in the liquid bath. The cover 37 is then attached, the apparatus is closed, and the argon is introduced into the enclosure 11 by the tube 12.

The power furnished by the inductor 55 is progressively increased until the thermocouple 56 indicates that the melting temperature of the alloy to be treated has been attained at the level of the sensing joint 57 coinciding with the mold bottom. When this has been achieved, a controller 6 for adjusting the power supply 7 to the inductor 55 in response to the information furnished by the thermocouple 56 is rendered operational. The position of the isotherm corresponding to the melting temperature of the alloy to be treated is thus made to depend on the position of the sensing joint 57 of the thermocouple 56. The phase of filling the mold 51 can then be begun. This filling phase is effected either by flowing the alloy, which has been preliminarily melted in an auxiliary apparatus, into the mold 51 or by introducing at an adjustable flow rate a premixed powder of the necessary composition into the mold 51 where it then becomes liquefied.

After the mold has been charged, advantageously by the second procedure indicated hereinabove (preferred by reason of its simplicity and its reliability), the piston 14 is displaced downwardly from its illustrated starting position by a rack 8 and a pinion 9 coupled with drive means 59. The movement of the piston entrains the tube 10, the tin bath 50, the mold 51 and the alloy A which it contains. In the course of the lowering of the piston 14, at a speed which can be on the order of one to several centimeters per hour, the controller adjusts the energization of the inductor 55 to maintain the temperature, in the region of the sensing joint 57 of the thermocouple 56, at the melting point of the alloy being treated. Thus, the speed of progression of the solidification front from the bottom of the charge A to its top is equal to the speed of displacement of the piston.

When the entire article is molded, i.e. when the charge has been lowered to an end position beneath the level of heat sensor 57, the displacement of the piston 14 is halted and the controller 6 is disconnected, the power furnished to the inductor 55 being reduced to a level just sufficient to maintain the tin of the bath 50 in the liquid state. After the temperature of the apparatus has sufficiently dropped, the cover 37 is again removed and the piston 14 is brought back to its initial position. The mold 51 is extracted from the bath of liquid tin, the apparatus is again closed and the chamber 11 is again filled with argon in preparation for a new molding cycle.

EXAMPLE I

For the fabrication of a planar aeronautical turbine blade having a length of 96 mm and a greatest transverse dimension of 38 mm, from a composite constituted by a matrix having a nickel base and a reinforcement phase constituted by fibers of niobium carbide, an apparatus having the following characteristics was used:

graphite container (tube 10): outside diameter 60 mm, wall thickness 2.5 mm, length 230 mm;

cooler (copper sleeve 16): internal diameter 70 mm, length 250 mm;

distance from the base of the inductor 55 to the reference level lying at the highest point of the cooler (level of junction 32): 80 mm;

distance of the sensing joint 57 of the thermocouple 56 from the reference level: 60 mm;

melting point of the alloy subjected to the unidirectional solidification: 1350° C.; and thermal gradient at the level of the solidification front: 130° C./cm.

The mold 51, constituted by a shell made from very pure aluminum having an average thickness of 0.7 mm, was manufactured by deposition of Al by an oxyacetylenic blowpipe on a model which was subsequently eliminated, and was then subjected to a thermal recrystallization treatment at 1800° C.

Advantageously, the mold is so dimensioned that each of the end portions of the piece to be cast are a bit longer (by 10 to 15 mm) than the desired useful length for the finished article. In this manner it is possible to elminate the starting and finishing zones of the solidification by truncating them, as is often the case in numerous foundry operations. This truncating does not constitute, however, a machining operation which shapes the molded article.

The charge to be treated was made by pouring a pre-alloyed powder of an average granulometry equal to 200 microns whose composition by weight was Co 20%, Cr 10%, W 10%, Al 4%, Nb 4.9%, C 0.55%, balance Ni.

The speed of displacement of the solidification front was 1 cm/hour.

Figure 2:
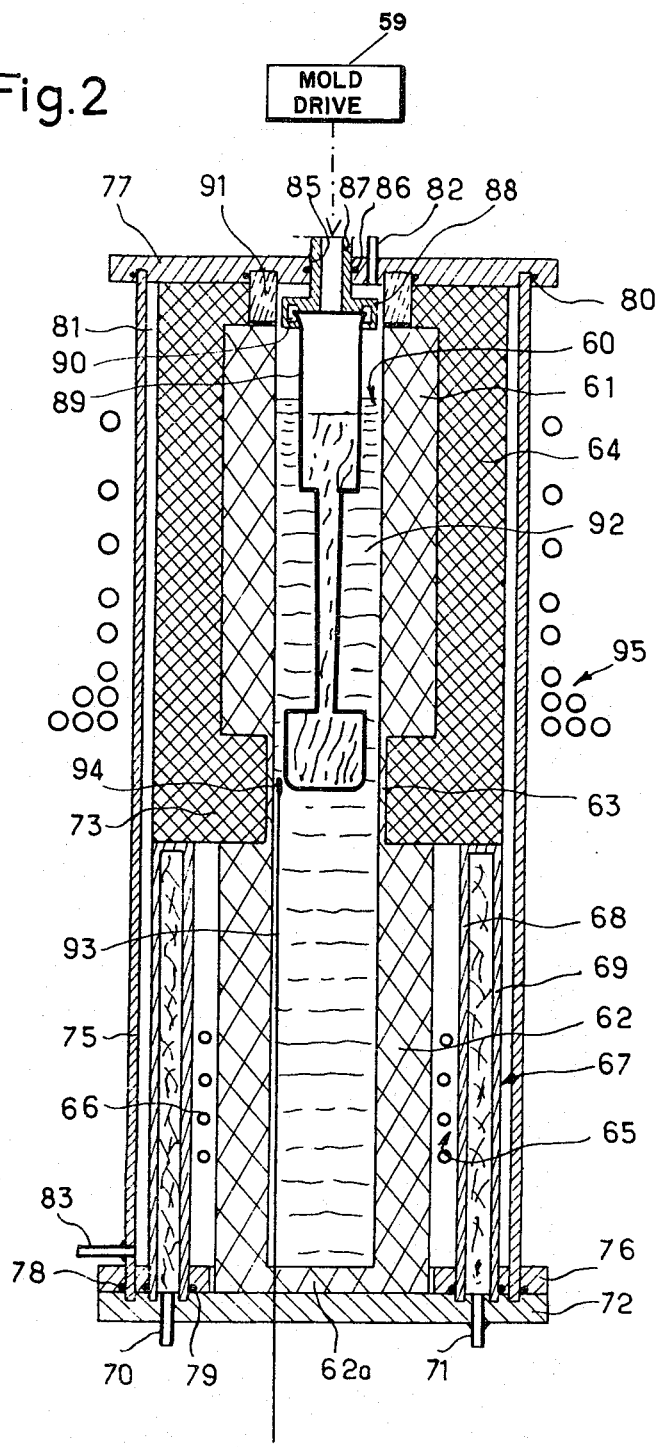
FIG. 2 is a view similar to that of FIG. 1, showing a second embodiment of the invention.

In the embodiment shown in FIG. 2, the apparatus comprises a container 60 of graphite, having an upper tubular portion 61 of large wall thickness, a lower tubular section 62 of equally large wall thickness closed by a bottom 62a and, between these two portions, a central section 63, also tubular but of substantially smaller wall thickness. The central portion 63 and the upper portion 61 are encased in a sleeve 64 of graphite packing. The packing acts as a thermal insulator designed to avoid radial heat losses and at its lower end has an annular zone 73 of greater thickness than the rest of its wall. The lower portion 62 of the graphite container is surrounded by a cooler 65 with optional interposition of an auxiliary resistance heater 66 of adjustable power extending over only a portion of the height of the cooler. As in the preceding embodiment, the cooler 65 is constituted by a copper sleeve 67 having two walls 68 and 69 enclosing a space for the circulation of water introduced by a tube 70 and exhausted through a tube 71.

The cooler 65, which rests on a base 72 with interposition of a seal 79, and the insulating sleeve 64 are enclosed in an envelope 75 having a double wall cooled by water circulation. The envelope may for example be made of silica. It is mounted on the base 72 by a flange 76 with interposition of a seal 78 and is closed at its upper end by a cover 77 with interposition of a seal 80.

Cover 77 together with the envelope 75 and the flange 76b defines a housing 81 in which an inert gas, advantageously argon, may be circulated by means of an inlet tube 82 traversing the cover 77 and an outlet tube 83 provided near the bottom of the envelope, adjacent the flange 76.

A graphite tube 87, whose lower end forms suspension means 88 for a mold 89, is mounted in a central opening 85 of the cover 77 with interposition of a sealing joint 86. A sealing joint 90, e.g. of graphite packing, is interposed between the mold 89 and the suspension means 88. An insulating ring 91 of graphite packing is provided at the upper end of the tubular portion 61, between the latter and the cover 77.

As in the preceding embodiment, the graphite container 60 is filled with a liquid metal, advantageously tin, forming a bath 92 in which the mold 89 is immersed along with a thermocouple 93 whose sensing joint 94 is generally positioned inside the reduced tubular portion 63 of the graphite container 60.

In this embodiment, again, the heat source is constituted by an inductor 95 of adjustable power or rate of energization. The inductor surrounds the silica envelope 75 and is connected, via a controller not shown, to the thermocouple 93.

This embodiment is operated analogously to that of FIG. 1, with the important exception, however, that the displacement of the solidification front is obtained by a downward movement of the mold 89 in the liquid tin column 92. The mold is entrained by the tube 87 which is linked with drive means 59 through a rack-and-pinion coupling such as that of FIG. 1, for example, adapted to impart to that tube, and consequently to the mold, a uniform low-speed motion which is smooth and jerk-free. Besides displacing the mold, the tube 87 serves to introduce into the mol 89, by a central channel, the alloy to be unidirectionally solidified.

The presence of a tube 61 of large wall thickness on the upper part of the graphite container furnishes an increased cross-section for passage of the thermal flux, permitting thus to limit the value of the temperature gradient in this zone and, as a result, to avoid overheating of the alloy bath in the course of the treatment.

The existence of a tube 62 of large wall thickness at the base of the container, on the one hand, and the presence of the auxiliary resistance heater 66, on the other hand, makes it possible to maintain the tin column in the liquid state down to the base 62a despite the cooling by radiation between the cold wall of the copper sleeve 67 and the tube 62, the resistance heater being put into operation when the entire article has been molded.

The elevated thermal gradient necessary for the execution of the unidirectional solidification process is obtained in the region 63 of reduced wall thickness of the graphite container 60 by a suitable positioning of the base of the inductor 95. The presence of a significant quantity of insulation around the neutral zone defined by the ring 73 makes it possible to obtain a planar isotherm in the region of the reduced container section 63 located beneath the base of the inductor.

EXAMPLE II

A solid blade of an aeronautical turbine, of 96 mm length and with a largest transverse dimension of 38 mm, was satisfactorily manufactured from a matrix having a nickel base, containing reinforcing fibers of niobium carbide, with an apparatus having the following characteristics:

Tubular sections of large wall thickness (61 and 62) of the graphite container (60):

internal diameter 40 mm; wall thickness 20 mm; length 150 mm;

Tubular central body (63):

internal diameter 40 mm; wall thickness 2.5 mm; length 40 mm.

A mold structurally identical with that of Example I, having a wall thickness of 0.7 mm, was shaped to provide at its top a molded funnel ending in a small collar engageable by the graphite tube 87. The thermal gradient was 150° C./cm and the speed of displacement of the solidification front was 1.25 cm per hour.

The embodiment just described can advantageously be utilized in an installation for the simultaneous fabrication of several shaped workpieces.

In such a case, the installation comprises a multiplicity of assemblies as shown in FIG. 2 disposed, for example, equi-angularly around the same axis with means common to all the assemblies for the displacement of the molds in the associated columns of liquid metal.

While we have described hereinabove certain embodiments of our invention, it is to be understood that the invention is not limited to the specific constructions disclosed but covers in addition all modifications falling within the scope of the appended claims.

We claim:

1. A process for molding an article of complex shape from a composite metallic refractory material by a unidirectional solidification of the composite material in a mold, comprising the steps of:
    (a) providing a bath of a heat-exchange liquid metal in the form of a substantially cylindrical column;
    (b) heating an upper part of said column above the melting point of said composite material while cooling a lower part of said column below said melting point;
    (c) fully immersing a charge-receiving part of said mold in said bath with the bottom of said mold at an intermediate level between said upper and lower parts at which the bath temperature substantially equals said melting point;
    (d) maintaining the immersion of the mold in the bath throughout the process;
    (e) introducing said composite material into the mold to form a charge therein heated by the surrounding bath above said melting point; and
    (f) controlling the heating of said column to maintain the bath temperature at said intermediate level substantially at said melting point while progressively lowering said mold within the bath with reference to said intermediate level for continuously advancing a solidification front in the composite material from the bottom of said mold to the top of said charge.

2. The process defined in claim 1 wherein said bath is lowered jointly with said mold in step (f).

3. The process defined in claim 1 wherein said bath is maintained stationary with respect to said intermediate level during lowering of said mold in step (f).

4. The process defined in claim 1 wherein said composite material is introduced into the mold after the latter has been heated to the temperature of the surrounding bath.

5. The process defined in claim 4 wherein said composite material is introduced into the mold as a prealloyed powder.

6. The process defined in claim 1 wherein said liquid metal solidifies at temperatures substantially below the melting point of said composite material and has a thermal conductivity close to that of said alloy in the vicinity of said melting point.

7. The process defined in claim 1 wherein said liquid metal is selected from the group consisting of tin, gallium and indium.

8. An article made by the process of claim 1.

9. An apparatus for molding an article of complex shape from a composite metallic refractory material by a unidirectional solidification of the composite material in a mold, comprising:

an upright container for a bath of heat-exchange liquid metal forming therein a substantially cylindrical column;

adjustable heat-generating means surrounding said container and including a heater for raising the temperature of an upper portion of said column above the melting point of said composite material and a cooler for maintaining the temperature of a lower portion of said column below said melting point, said heater and said cooler being vertically separated by a neutral zone;

temperature-sensing means in said neutral zone operatively coupled with said heat-generating means for establishing an intermediate level at which the bath temperature substantially equals said melting point;

mounting means for supporting a mold immersed in said bath, said mounting means being vertically movable with respect to said heat-generating means and said temperature-sensing means; and drive means coacting with said mounting means for lowering said mold from a starting position, in which the bottom of said mold lies at said intermediate level, to an end position in which a charge formed in said mold from said composite material lies below said intermediate level, said column extending upwardly above said intermediate level to keep said charge fully liquefied in said starting position whereby a solidification front coinciding with said intermediate level advances continuously from the bottom to the top of the charge upon progressive lowering of the mold into said end position.

10. The apparatus defined in claim 9 wherein said drive means includes a massive piston below said neutral zone reciprocable within said cooler, said container being seated on said piston at a location spaced from the mold bottom by a portion of said bath.

11. The apparatus defined in claim 9 wherein said mounting means is carried by said container at the upper end thereof and is slidably traversed by an extension of said temperature-sensing means.

12. The apparatus defined in claim 9 wherein said mounting means is disposed above said neutral zone for holding said mold suspended and is provided with feed means for the introduction of said composite material into the suspended mold.

13. The apparatus defined in claim 12 wherein said drive means is coupled with said mounting means.

14. The apparatus defined in claim 9 wherein said container is stationary with respect to said heat-generating means and has upper and lower sections of increased wall thickness in the regions of said heater and said cooler which are interconnected by a reduced section at said neutral zone, further comprising a thermally insulating sleeve interposed between said heater and the upper container section, said sleeve being provided with a portion of enlarged wall thickness surrounding said reduced section.

15. The apparatus defined in claim 9, further comprising fluid-circulation means communicating with the interior of said container for maintaining an inert atmosphere above said bath.

16. The apparatus defined in claim 9 wherein said liquid metal is selected from the group consisting of tin, gallium and indium.

* * * * *